(12) United States Patent
De Steur et al.

(10) Patent No.: US 6,781,092 B2
(45) Date of Patent: Aug. 24, 2004

(54) METHOD FOR DRILLING HOLES IN A SUBSTRATE

(75) Inventors: Hubert De Steur, Drongen (BE); Alexander Kilthau, Bad Schoenborn (DE); Andre Kletti, Sandhausen (DE); Hans Juergen Mayer, Viernheim (DE); Petra Mitzinneck, Karlsruhe (DE); Eddy Roelants, Brugge (BE); Oliver Thuerk, Graben-Neudorf (DE); Marc Van Biesen, Gent (BE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/369,623

(22) Filed: Feb. 21, 2003

(65) Prior Publication Data

US 2003/0201260 A1 Oct. 30, 2003

(30) Foreign Application Priority Data

Feb. 21, 2002 (DE) .......................................... 102 07 288

(51) Int. Cl.$^7$ .............................................. B23K 26/00
(52) U.S. Cl. ............................ 219/121.71; 219/121.79; 219/121.85

(58) Field of Search ........................ 219/121.71, 121.79, 219/121.85, 121.7, 121.78, 121.8, 121.81

(56) References Cited

U.S. PATENT DOCUMENTS

| 5,593,606 | A |   | 1/1997 | Owen et al. |            |
|-----------|---|---|--------|-------------|------------|
| 5,841,099 | A | * | 11/1998| Owen et al. | 219/121.69 |
| 5,856,649 | A |   | 1/1999 | Yamazaki et al. |        |
| 6,433,301 | B1| * | 8/2002 | Dunsky et al. | 219/121.67 |
| 6,518,543 | B1| * | 2/2003 | Benz et al. | 219/121.71 |
| 6,541,732 | B2| * | 4/2003 | Hirose et al. | 219/121.7 |
| 2003/0102291 | A1 | * | 6/2003 | Liu et al. | 219/121.73 |
| 2003/0213787 | A1 | * | 11/2003 | Dunsky et al. | 219/121.75 |

* cited by examiner

*Primary Examiner*—M. Alexandra Elve
(74) *Attorney, Agent, or Firm*—Harness, Dickey & Pierce, P.L.C.

(57) ABSTRACT

When holes are being drilled in an electric circuit substrate, a laser beam is moved on concentric circular tracks in the region of the hole to be drilled. The transition from one circular track to the next takes place in each case on an arc that departs approximately tangentially from the circular track last traversed and nestles approximately tangentially against the circular track newly to be described in such a way that in each case the starting point of a new circular track is offset by a prescribed angle from the starting point of the preceding circular track.

22 Claims, 2 Drawing Sheets

METHOD FOR DRILLING HOLES IN A SUBSTRATE

The present application hereby claims priority under 35 U.S.C. §119 on German patent application number 10207288.4 filed Feb. 21, 2002, the entire contents of which are hereby incorporated herein by reference.

FIELD OF THE INVENTION

The present invention generally relates to a method for drilling holes in a substrate by way of a laser beam, in particular in an electric circuit substrate. The laser beam may be centered, with its axis on the substrate, in a region of the hole to be drilled and then moved within a cross-sectional area of the hole to be drilled with a beam spot diameter that is smaller than the diameter of the hole to be drilled in concentric circular tracks with a radius changing in steps.

BACKGROUND OF THE INVENTION

A drilling method is disclosed in U.S. Pat. No. 5,593,606, where holes with a larger diameter than a beam diameter of a laser being are produced by virtue of the fact that the laser beam is moved from inside to outside or from outside to inside either in spiral tracks or in concentric circles within the region of the hole. Moving the laser beam in a spiral track results in asymmetry of the drilled hole, in particular the end of the spiral track leaving behind a step in the course of the rim of the hole.

It is expedient when drilling by way of circular movements of the laser beam always to cover full circles, in order to produce a hole that is as circular as possible. In this case, the beam is usually moved on the shortest path, that is to say in the radial direction, in each case when changing from one circular track to another of different radius. The starting points for all circular tracks consequently all lie on a radial line. When the laser outputs further pulses during this radial movement between the individual circular tracks, this has the effect of an additional input of energy in the direction of this radial line and, overall, of an asymmetric energy distribution in the hole area. However, if the laser is switched off during the radial movement, the result nevertheless is an unclean drilling course in the transition region between the radial movement and the circular movement, because in each case after the laser is switched on again the first pulses have a somewhat different energy profile than the remaining pulses. These asymmetries are also all situated in a radial direction and therefore add together to form an asymmetry at the rim of the hole.

It is also disadvantageous with this type of beam guidance that the laser beam has to accomplish a change in direction of 90° in each case upon transition from the radial movement to the circular movement, and must be stopped briefly in each case for this purpose and started up in the new direction. The overall result is an unfavorable movement cycle for the deflecting unit of the laser.

SUMMARY OF THE INVENTION

An embodiment of the present invention may improve a method for laser drilling in such a way that the movement cycle of the laser beam in the hole region is more favorably configured, and that the shape of the hole can properly shaped, that is formed in a proper circular shape.

An embodiment of the present invention provides a method where the transition from one circular track to the respective next circular track having a different radius takes place in each case in the form of an arc which departs approximately tangentially from the circular track last traversed and nestles approximately tangentially against the circular track newly to be described, in such a way that in each case the starting point of a new circular track is offset by a prescribed angle from the starting and end points of the preceding circular track.

The offset of the starting points on the individual concentric circular tracks that asymmetries in the energy input that occur in each case at the start of a circular track, for example owing to inadequate suppression of the initial pulses, are distributed over the entire circumference, thus producing holes that are as symmetrical as possible, that is to say circular. Moreover, substantially no sharp changes in direction of the laser beam are required owing to a direct transition from a radial movement to a circular movement, as a result of which it is possible overall to achieve a more uniform speed of the individual elements in the deflecting unit and a more uniform pulse train, and this means in turn that the energy distribution on the individual circular tracks and in the entire hole to be drilled is rendered more uniform.

The starting points of the circular tracks traversed by the laser beam during drilling of a hole are preferably distributed uniformly over the entire circumference. Depending on the material of the hole to be drilled, the hole size and the laser properties used, the individual circular tracks can be traversed once or else several times. This can happen in a way that each circular track is traversed several times one after the other before the laser beam is then directed onto the next circular track. However, it is expedient to traverse all the circular tracks once each with offset starting points in a cycle in each case, and once again to traverse each circular track once each in a next cycle, the starting points of the individual circular tracks differing in each cycle from the preceding cycle.

The shape of the arc in the case of the offset movement from one circular track to the next can be selected to differ. Particularly advantageous in this case is the shape of a quarter ellipse, an offset between the starting and end points of approximately 90° being produced in each case.

It is expedient for the laser beam to be controlled such that an energy input occurs in each case only when the laser beam moves on one of the circular tracks, while no energy input occurs on the arc between the circular tracks. This can be done, for example, by switching off the laser beam in the time of the arcuate movement between two circular tracks. Another, particularly advantageous possibility is that the laser beam, which outputs pulses of high energy density during the productive drilling movement on the circular tracks, is switched over into a continuous wave mode of low energy density in each case on the arcuate sections between the circular tracks.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
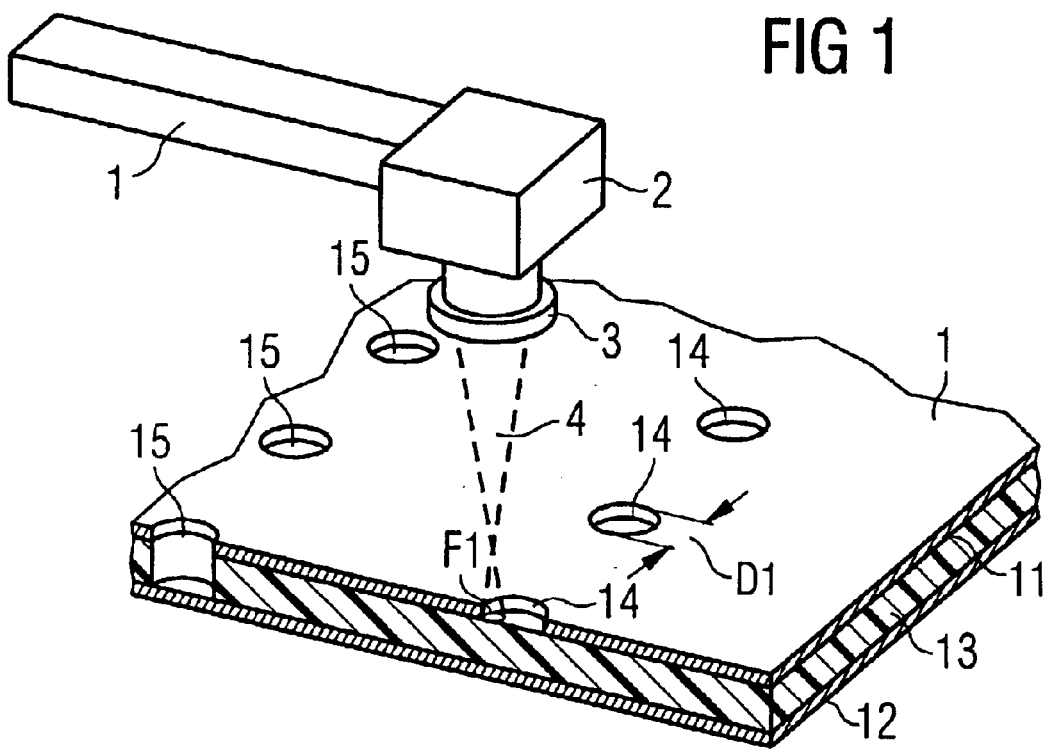
FIG. 1 shows a schematic of a laser arrangement for drilling holes in a multilayer substrate.

The arrangement shown schematically and in no way true to scale in FIG. 1 shows a laser 1 with a deflecting unit 2 and an optical imaging unit 3 via which a laser beam 4 is directed onto a substrate 10. In the example shown, this substrate has an upper, first metal layer (copper layer) 11 and a lower, second metal layer 12, between which a dielectric layer 13 is arranged. This dielectric layer consists, for example, of a polymer material such as RCC or a glass-fiber-reinforced polymer material such as FR4. It is known that the metal layers, which consist of copper as a rule, require a different amount of energy for processing or transmission than does a dielectric. It is also possible correspondingly to select different laser settings such as different pulse repetition rates and different focusing of the laser beam.

As is shown in FIG. 1, the aim is to drill blind holes with a diameter D1 in each case into the substrate 1. It is possible for this purpose, for example, to drill holes 14 through the copper layer 11 with a first setting of the laser, and then the blind holes 15 can be introduced into the dielectric layer 13 with a different laser setting. Irrespective of which material is being drilled, it is assumed in this case that the laser beam 4 is moved in each case with its focal spot F1 in concentric circles in the region of the hole to be drilled until the material is completely removed from the relevant hole 14 or 15.

Figure 2:
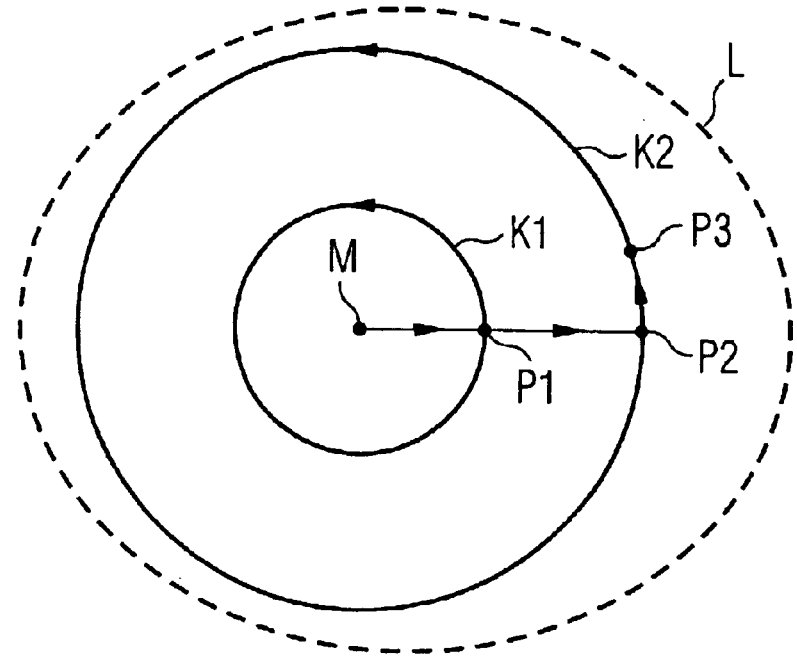
FIG. 2 shows the scheme of a conventional drilling movement on circular tracks.

In the case of a conventional method as illustrated schematically in FIG. 2, the laser beam is firstly centered onto the midpoint M of the hole to be drilled and moved from there in the radial direction up to a first circular track where it begins its circular movement over the circular track K1 at the point P1. Once the beam has returned to point P1, it is stopped and moved again in the radial direction up to the circular track K2, where it then carries out its circular movement on this track K2 starting from point P2. The drilling movement ends with a slight overlap from point P2 up to P3. This type of drilling movement in concentric tracks with radial intermediate steps is performed mostly with lasers that operate continuously, since irregularities in the removal of material occur in the case of intermediately switching off during the radial movement at the respective starting points P1 and P2. The radial movement and the arrangement of the starting points P1 and P2 in a radial line produce a drill hole whose circumference L does not maintain the desired circular shape, but has a bulge to the right.

Figure 3:
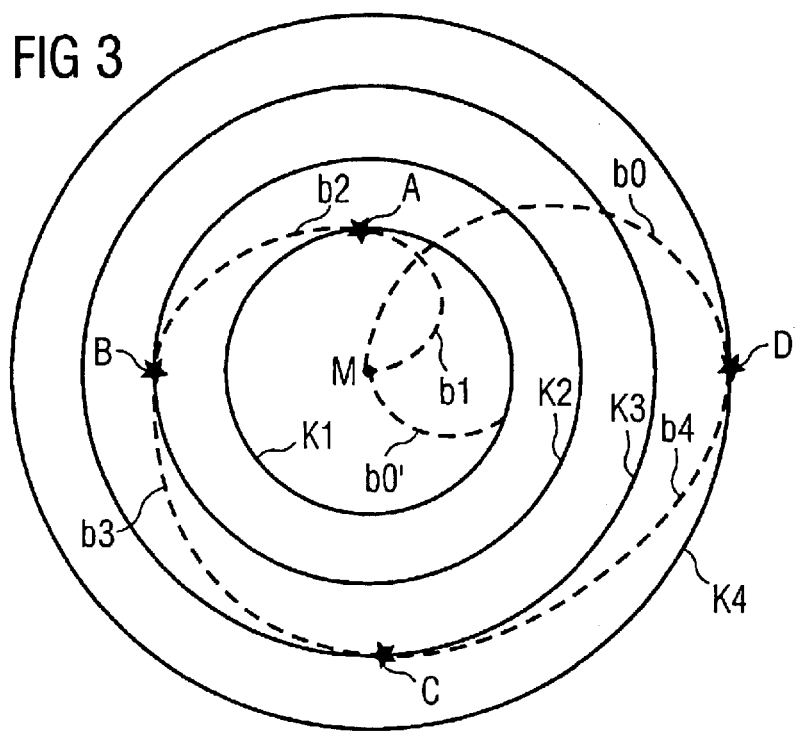
FIG. 3 shows the scheme of an inventive drilling movement of a laser beam on four concentric circular tracks.

FIG. 3 shows the movement of the laser beam in the case of the method according to the invention. In this case, as well, the laser beam is initially centered onto the midpoint M of the hole to be drilled. Starting from there, it firstly executes an arcuate movement on the arc section b1, preferably a circular arc, up to the starting point A on the first circular track K1. Proceeding from the starting point A, the pulsed laser beam traverses the circular track K1 until it arrives again at the starting point A after the end of this circular track. Proceeding from this starting point A, it then moves on an arcuate section b2 up to the next starting point B on the circular track K2. The arcuate section b2 is preferably a quarter-ellipse and effects an angular offset of 90° between the starting point A and the starting point B.

Proceeding from the starting point B, the laser beam then moves on the circular track K2 until this circle is closed. Thereafter, the laser beam moves again on an arcuate section b3 up to the starting point C on the next circular track K3. Once this circular track K3 has been traversed, the laser beam moves on the arcuate section b4 to the starting point D on the circular track K4. Once this circular track has also been traversed, the laser beam can be moved via a further arcuate section b0 back to the center M; from there it can be moved to the next hole or to the center thereof, or it can return via an arcuate section b0' to the inner circle K1, in order to begin in the same hole a new cycle with concentric circular movements. However, it is also possible to move the laser beam to a new drilling hole directly preceding from the point D.

As mentioned, the laser preferably outputs a pulsed energy beam in each case on the circular tracks. The laser beam is switched off on the arcuate sections b1 to b4 or b0, or operated in continuous wave mode with a low energy density.

Figure 4:
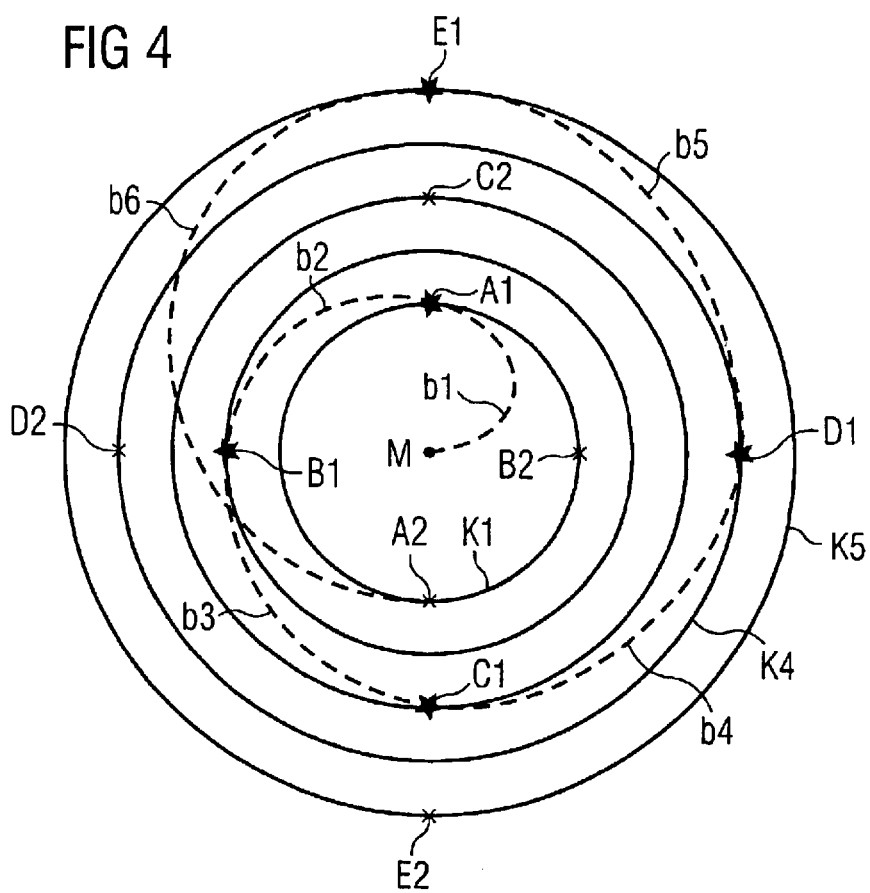
FIG. 4 shows a movement cycle, modified from FIG. 3, of a laser beam, five concentric circular tracks being traversed successively in two cycles.

FIG. 4 shows a movement cycle similar to FIG. 3. Described here is a case with five concentric circular tracks K1 to K5, the path from one circular track to the next being covered in each case via arcuate sections b1 to b5. In this case, the path then runs from the starting point E1 after traversing the circular track K5 via the arcuate section b6 back to the innermost circular track K1, although to a new starting point A2, preceding from which it begins a new cycle in which all the circular tracks K1 to K5 are traversed one after another. Transition from one circular track to the next is also performed here once again via arcuate sections that are not drawn here, for the sake of clarity. Since, in each case the starting points of the second cycle, specifically A2 to E2, are situated in each case opposite the starting points A1 to E1 of the first cycle on the circular tracks K1 to K5, the result is a largely symmetric energy distribution of the laser radiation introduced over two cycles.

The invention is not, of course, limited to the exemplary embodiments illustrated. Variations in the angular offset of the individual starting points are possible. Again, the individual circular tracks can be traversed in reverse sequence such that in this case the laser beam firstly traverses the outer circular tracks followed by the inner ones.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for drilling holes in a substrate, comprising:
   centering a laser beam on the substrate at a region of a hole to be drilled, and
   moving the laser beam within the cross-sectional area of the hole with a beam spot diameter that is smaller than a hole diameter in concentric circular tracks with a radius changing in steps,
   wherein a transition from one circular track to a respective next circular track (K1 to K5) having a different radius takes place in each case in the form of an arc (b1 to b6) departing approximately tangentially from a circular track last traversed, the circular track last traversed nestled approximately tangentially against a next circular track in such a way that in each case a starting point (A to E; A1 to E2) of the next circular track (K2 to K6) is offset by a prescribed angle from starting and end points of a preceding circular track (K1 to K5).

2. The method as claimed in claim 1, wherein the starting points (A to E; A1 to E2) of the circular tracks (K1 to K6) traversed by the laser beam during drilling of the hole are distributed over an entire circumference of the hole with the same angular offset in each case.

3. The method as claimed in claim 1, wherein the arc (b2 to b6) from one circular track (K1 to K5) to a next circular track (K2 to K6) describes the shape of a segment of an ellipse in each case.

4. The method as claimed in claim 1, wherein the laser beam is switched off in each case during an arcuate movement of an axis thereof from one circular track to the next.

5. The method as claimed in claim 1, wherein the laser beam outputs pulses of high energy density in each case during movement on the circular tracks (K1 to K5), the laser beam being switched to a continuous wave mode of low energy density during an arcuate movement (b1 to b5) from one circular track (K1 to K5) to the next.

6. The method as claimed in claim 1, wherein the laser beam traverses each circular track (K1 to K5) several times before it is moved to a starting point of a immediately following circular track (K2 to K5).

7. The method as claimed claim 1, wherein the laser beam traverses all the circular tracks (K1 to K5) once each in a first cycle, and thereafter traverses each of the circular tracks (K1 to K5) again in a new cycle or in a plurality of new cycles.

8. The method as claimed in claim 7, wherein the starting points (A1 to E1; A2 to E2) of the individual circular tracks are selected differently in each cycle.

9. The method as claimed in claim 2, wherein the arc (b2 to b6) from one circular track (K1 to K5) to a next circular track (K2 to K6) describes the shape of a segment of an ellipse in each case.

10. The method as claimed in claim 2, wherein the laser beam is switched off in each case during an arcuate movement of an axis thereof from one circular track to the next.

11. The method as claimed in claim 3, wherein the laser beam is switched off in each case during an arcuate movement of an axis thereof from one circular track to the next.

12. The method as claimed in claim 2, wherein the laser beam outputs pulses of high energy density in each case during movement on the circular tracks (K1 to K5), the laser beam being switched to a continuous wave mode of low energy density during an arcuate movement (b1 to b5) from one circular track (K1 to K5) to the next.

13. The method as claimed in claim 3, wherein the laser beam outputs pulses of high energy density in each case during movement on the circular tracks (K1 to K5), the laser beam being switched to a continuous wave mode of low energy density during an arcuate movement (b1 to b5) from one circular track (K1 to K5) to the next.

14. The method as claimed in claim 2, wherein the laser beam traverses each circular track (K1 to K5) several times before it is moved to a starting point of a immediately following circular track (K2 to K5).

15. The method as claimed in claim 3, wherein the laser beam traverses each circular track (K1 to K5) several times before it is moved to a starting point of a immediately following circular track (K2 to K5).

16. The method as claimed in claim 4, wherein the laser beam traverses each circular track (K1 to K5) several times before it is moved to a starting point of a immediately following circular track (K2 to K5).

17. The method as claimed in claim 5, wherein the laser beam traverses each circular track (K1 to K5) several times before it is moved to a starting point of a immediately following circular track (K2 to K5).

18. The method as claimed claim 2, wherein the laser beam traverses all the circular tracks (K1 to K5) once each in a first cycle, and thereafter traverses each of the circular tracks (K1 to K5) again in a new cycle or in a plurality of new cycles.

19. The method as claimed claim 3, wherein the laser beam traverses all the circular tracks (K1 to K5) once each in a first cycle, and thereafter traverses each of the circular tracks (K1 to K5) again in a new cycle or in a plurality of new cycles.

20. The method as claimed claim 4, wherein the laser beam traverses all the circular tracks (K1 to K5) once each in a first cycle, and thereafter traverses each of the circular tracks (K1 to K5) again in a new cycle or in a plurality of new cycles.

21. The method as claimed claim 5, wherein the laser beam traverses all the circular tracks (K1 to K5) once each in a first cycle, and thereafter traverses each of the circular tracks (K1 to K5) again in a new cycle or in a plurality of new cycles.

22. The method as claimed claim 6, wherein the laser beam traverses all the circular tracks (K1 to K5) once each in a first cycle, and thereafter traverses each of the circular tracks (K1 to K5) again in a new cycle or in a plurality of new cycles.

* * * * *